United States Patent
Murakami

(10) Patent No.: US 7,786,794 B2
(45) Date of Patent: Aug. 31, 2010

(54) AMPLIFIER CIRCUIT

(75) Inventor: Hideaki Murakami, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 12/404,391

(22) Filed: Mar. 16, 2009

(65) Prior Publication Data
US 2009/0231036 A1 Sep. 17, 2009

(30) Foreign Application Priority Data
Mar. 17, 2008 (JP) ............... 2008-068460

(51) Int. Cl.
*H03F 1/02* (2006.01)
(52) U.S. Cl. .......................... 330/9; 327/124
(58) Field of Classification Search ............ 330/9; 327/124, 307
See application file for complete search history.

(56) References Cited

U.S. PATENT DOCUMENTS 5,084,639 A * 1/1992 Ribner ................. 327/311
6,566,942 B2 * 5/2003 Shigenobu .............. 330/9
6,822,509 B2 * 11/2004 Muza ................... 330/9
7,456,684 B2 * 11/2008 Fang et al. .............. 330/9

FOREIGN PATENT DOCUMENTS

JP 2006-174091 6/2006
JP 2008-235998 10/2008

* cited by examiner

*Primary Examiner*—Henry K Choe
(74) *Attorney, Agent, or Firm*—Dickstein Shapiro LLP

(57) ABSTRACT

An amplifier circuit is disclosed that includes a first input terminal; a second input terminal; a first differential amplifier circuit that samples signals input to the first and second input terminals and outputs signals obtained by applying a gain to the sampled input signals having different voltages; and a second differential amplifier circuit that supplies first and second reference voltages referred to when a sampling operation is performed in the first differential amplifier circuit to the first and second input terminals, respectively. A potential difference between the first and second reference voltages is equal to an offset voltage of the first differential amplifier circuit.

6 Claims, 4 Drawing Sheets

AMPLIFIER CIRCUIT

BACKGROUND OF THE INVENTION

1. Field of the Invention

The present invention relates to an amplifier circuit that samples input signals and outputs signals obtained by applying a gain to the sampled input signals having different voltages.

2. Description of the Related Art

In video equipment using a solid-state image pickup device such as a CCD (Charge Coupled Device), a correlation double sampling circuit (CDS) and a variable gain amplifier circuit (PGA) are used so that the noise of a video signal from the solid-state image pickup device is eliminated and the signal itself is amplified with a prescribed gain. In the CDS and PGA, an amplifier circuit composed of a switched capacitor circuit is conventionally used. For example, Patent Document 1 describes a differential amplifier circuit composed of a switched capacitor circuit.

FIG. 1 shows the conventional differential amplifier circuit composed of the switched capacitor circuit. The differential amplifier circuit 10 shown in FIG. 1 is composed of a full differential amplifier circuit 11, switches SW1, SW2, SW3, SW4, SW5, SW6, SW7, and SW8, and capacitors Cs and Cf. The differential amplifier circuit 11 is connected to, for example, an external device 12 that outputs signals to be amplified. The external device 12 represents, for example, a solid-state image pickup device that outputs video signals to be amplified. The operations of the differential amplifier circuit 11 are described below.

At a sampling operation in the differential amplifier circuit 11, the switches SW1, SW2, SW4, SW5, and SW8 are turned on, and the switch SW3 is turned off. A reference voltage Vref2 is supplied to the switches SW6 and SW7. At this time, signals output from the external device 12 are input to input terminals Vip and Vim, and an electrical charge corresponding to a potential difference between a standard voltage Vref1 and the input signals is stored in the capacitors Cs. Furthermore, both outputs from the full differential amplifier circuit 11 are short-circuited by the switch SW8, and an electrical charge corresponding to a potential difference between the standard voltage Vref1 and the reference voltage Vref2 is stored in the capacitors Cf via the switches SW6 and SW7.

Then, when the sampling operation is completed to establish a signal output state, the switches SW1, SW2, SW4, SW5, and SW8 are turned off, and the switch SW3 is turned on. The switches SW6 and SW7 are connected to the outputs of the full differential amplifier circuit 11. At this time, the one terminal of the capacitors Cs is short-circuited to have the same potential as the other terminal thereof, which in turn moves the electrical charges stored in the capacitors Cs to the capacitors Cf. Accordingly, a potential difference Vop−Vom in the outputs of the full differential amplifier circuit 11 is calculated according to the following formula.

$$Vo = Vop - Vom = Cs/Cf \times \{(Vip - Vref1) - (Vim - Vref1)\} = Cs/Cf \times (Vip - Vim) \quad (1)$$

From the above formula (1), it is found that the gain of the full differential amplifier circuit 11 in the amplifier circuit 10 is determined by the ratio of the capacitors Cs to the capacitors Cf.

Patent Document 1: JP-A-2006-174091

However, the above formula (1) according to the conventional art does not take the offset voltage Voff of the full differential amplifier circuit 11 into consideration, but it includes an error as shown in the following formula (2).

$$Vo = Vop - Vom = Cs/Cf \times (Vip - Vim + Voff) \quad (2)$$

SUMMARY OF THE INVENTION

The present invention has been made in light of the above circumstances and may provide an amplifier circuit capable of having improved characteristics without being influenced by an offset voltage.

According to an aspect of the present invention, there is provided an amplifier circuit including a first input terminal; a second input terminal; a first differential amplifier circuit that samples signals input to the first and second input terminals and outputs signals obtained by applying a gain to the sampled input signals having different voltages; and a second differential amplifier circuit that supplies first and second reference voltages referred to when a sampling operation is performed in the first differential amplifier circuit to the first and second input terminals, respectively. A potential difference between the first and second reference voltages is equal to an offset voltage of the first differential amplifier circuit.

Other objects, features and advantages of the present invention will become more apparent from the following detailed description when read in conjunction with the accompanying drawings.

DETAILED DESCRIPTION OF THE PREFERRED EMBODIMENTS

According to embodiments of the present invention, at a sampling operation in a differential amplifier circuit, a potential difference between a first reference voltage supplied to a first input terminal and a second reference voltage supplied to a second input terminal is set to be equal to the offset voltage of the differential amplifier circuit, thereby making it possible to cancel the offset voltage. As a result, the characteristics of an amplifier circuit can be improved.

First Embodiment

Figure 1:
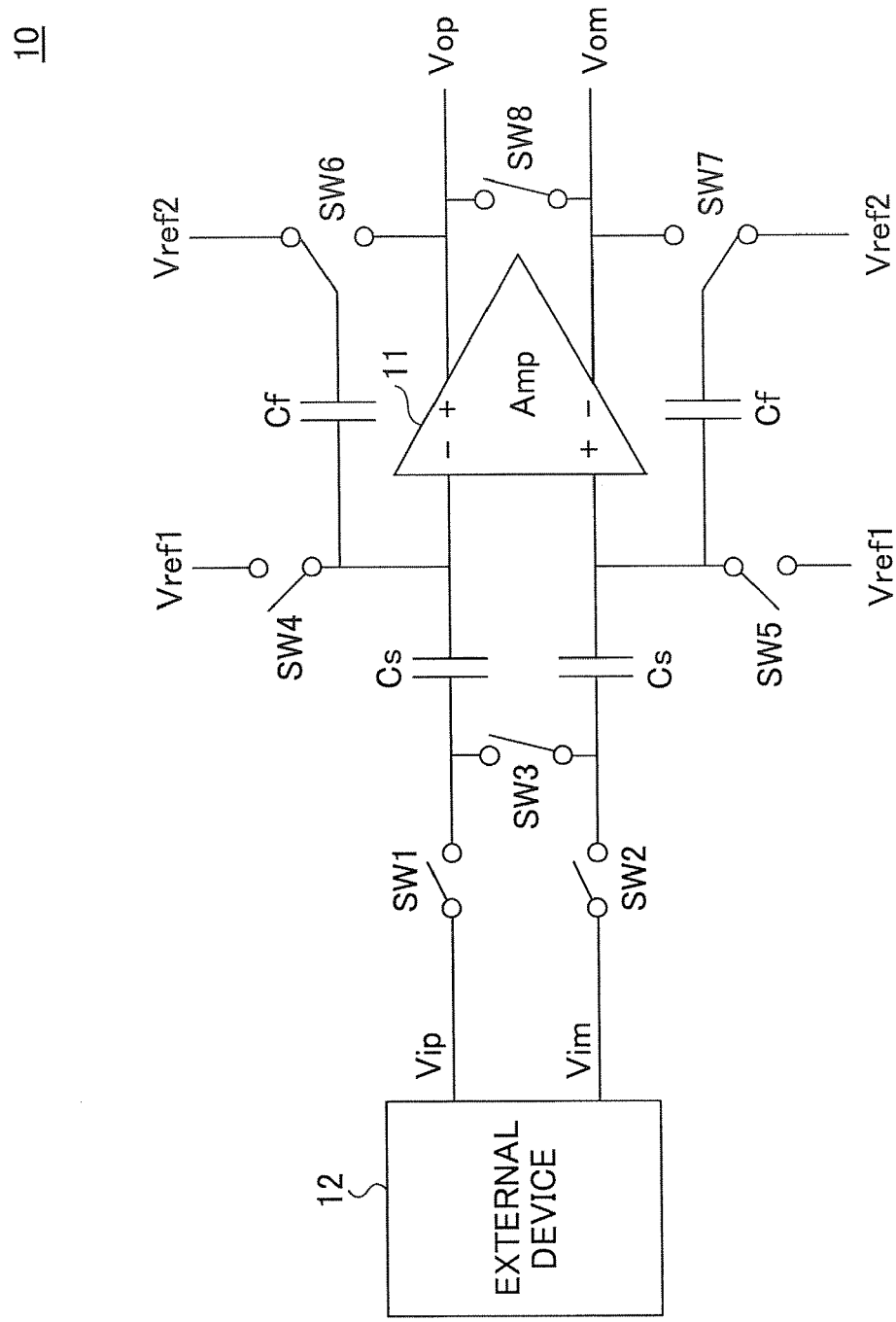
FIG. 1 shows a conventional differential amplifier circuit composed of a switched capacitor circuit.
Figure 2:
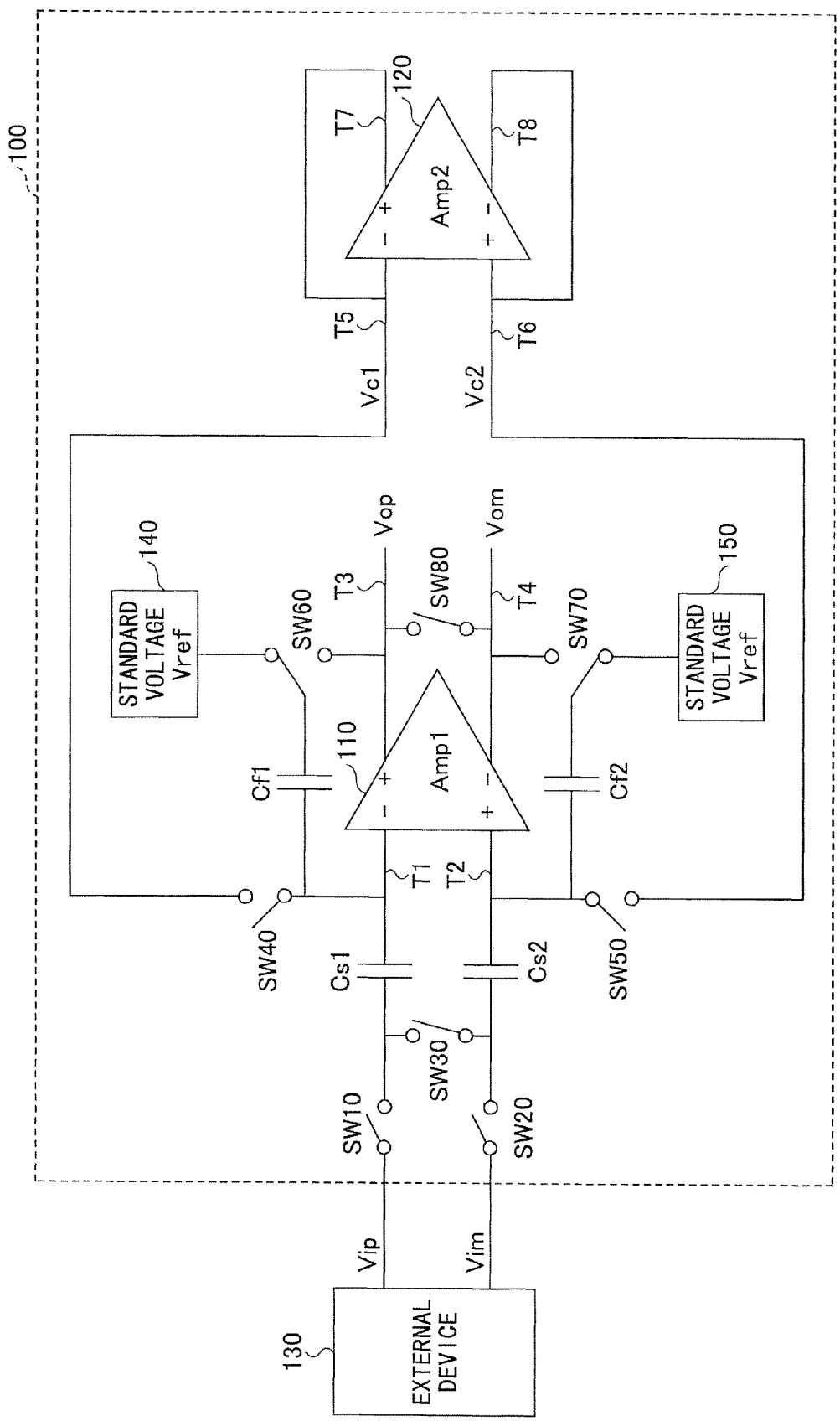
FIG. 2 shows the amplifier circuit 100 of a first embodiment.

Referring to the accompanying drawing, a description is now made of a first embodiment of the present invention. FIG. 2 shows an amplifier circuit 100 of the first embodiment.

The amplifier circuit 100 of the first embodiment is configured of a first differential amplifier circuit 110, a second differential amplifier circuit 120, switches SW10 SW20, SW30, SW40, SW50, SW60, SW70, and SW80, and capacitors Cs1, Cs2, Cf1, and Cf2. Note that the capacitors Cs1 and Cs2 are capacitors having the same capacitance, and the capacitance of the capacitors Cs1 and Cs2 is represented as Cs. Furthermore, the capacitors Cf1 and Cf2 are capacitors having the same capacitances, and the capacitance of the capacitors Cf1 and Cf2 is represented as Cf.

In this embodiment, an inverting input terminal T1 of the differential amplifier circuit 110 is connected to one end of the capacitor Cs1, one end of the switch SW40, and one end of the capacitor Cf1. Furthermore, a non-inverting input terminal T2 of the differential amplifier circuit 110 is connected to one end of the capacitor Cs2, one end of the switch SW50, and one end of the capacitor Cf2. The other end of the capacitor Cs1 is connected to one end of the switch SW10 and one end of the switch SW30. The other end of the capacitor Cs2 is connected to one end of the switch SW20 and the other end of the switch SW30.

The other ends of the switches SW10 and SW20 are connected to the input terminals Vip and Vim of the amplifier circuit 100 of this embodiment, respectively. The input terminals Vip and Vim are connected to an external device 130. Note that the external device 130 of this embodiment represents, for example, a device that outputs a signal to be amplified by the amplifier circuit 100, such as a solid-state image pickup device that outputs a video signal or the like to be amplified.

The other end of the capacitor Cf1 is connected to either a standard voltage source 140 that generates a standard voltage Vref or a first output terminal T3 of the differential amplifier circuit 110 via the switch SW60. The other end of the capacitor Cf2 is connected to either a standard voltage source 150 that generates the standard voltage Vref or a second output terminal T4 of the differential amplifier circuit 110 via the switch SW70. Furthermore, the switch SW80 is connected between the output terminals T3 and T4 of the differential amplifier circuit 110.

The other end of the switch SW40 is connected to an inverting input terminal T5 of the differential amplifier circuit 120. The inverting input terminal T5 of the differential amplifier circuit 120 is connected to a first output terminal T7 of the differential amplifier circuit 120. The other end of the switch SW50 is connected to a non-inverting input terminal T6 of the differential amplifier circuit 120. The non-inverting input terminal T6 of the differential amplifier circuit 120 is connected to a second output terminal T8 of the differential amplifier circuit 120. Accordingly, the input and output terminals of the differential amplifier circuit 120 are short-circuited. In this embodiment, the voltage of the inverting input terminal T5 of the differential amplifier circuit 120 is defined as a first reference voltage (voltage Vc1), and the voltage of the non-inverting input terminal T6 thereof is defined as a second reference voltage (voltage Vc2).

In this embodiment, the configuration of the differential amplifier circuit 120 is the same as that of the differential amplifier circuit 110. In other words, the offset voltage of the differential amplifier circuit 120 is set to be equal to that of the differential amplifier circuit 110.

With this configuration, the following problem can be solved in this embodiment. For example, when a potential difference between the signals input to the input terminals Vip and Vim is about 1 V in the amplifier circuit 100 of this embodiment, an offset voltage Voff depends on the manufacturing tolerance of transistors inside the differential amplifier circuit 110. Here, several millivolts (mV) of offset voltages are generated. The gain accuracy demanded under an environment in which the amplifier circuit 100 of this embodiment is used is about 1/1000. Therefore, an error caused by the offset voltage exceeds a tolerance, which results in degradation in the characteristics of the amplifier circuit 100.

In order to deal with the above problem, the offset voltage of the differential amplifier circuit 110 is cancelled to eliminate influences due to the offset voltage in this embodiment.

The operations of the amplifier circuit 100 are described below.

First, a sampling operation in the amplifier circuit 100 of this embodiment is described. At the sampling operation in the amplifier circuit 100 of this embodiment, the switches SW10, SW20, SW40, SW50, and SW80 are turned on, and the switch SW30 is turned off. Furthermore, the switches SW60 and SW70 are connected to the standard voltage sources 140 and 150 that generate the standard voltage Vref, respectively.

At this time, signals from the external device 130 are input to the input terminals Vip and Vim of the amplifier circuit 100, and a reference voltage Vc1 is supplied to the capacitor Cs1 via the switch SW40. Furthermore, a reference voltage Vc2 is supplied to the capacitor Cs2 via the switch SW50. Accordingly, an electrical charge corresponding to a potential difference between the reference voltage Vc1 and the signal supplied to the input terminal Vip is stored in the capacitor Cs1. Furthermore, an electrical charge corresponding to a potential difference between the reference voltage Vc2 and the signal supplied to the input terminal Vim is stored in the capacitor Cs2.

Furthermore, an electrical charge corresponding to a potential difference between the standard voltage Vref and the reference voltage Vc1 is stored in the capacitor Cf1 via the switch SW60. Furthermore, an electrical charge corresponding to a potential difference between the standard voltage Vref and the reference voltage Vc2 is stored in the capacitor Cf2 via the switch SW70.

Here, the input and output terminals of the differential amplifier circuit 120 are short-circuited. Therefore, the reference voltage Vc1 output from the output terminal T7 of the differential amplifier circuit 120 and the reference voltage Vc2 output from the output terminal T8 thereof are output with the potential difference corresponding to the offset voltage of the differential amplifier circuit 120.

Next, an operation in the amplifier circuit 100 of this embodiment after the completion of the sampling operation is described.

When the sampling operation is completed to establish a signal output state in the amplifier circuit of this embodiment, the switches SW10, SW20, SW40, SW50, and SW80 are turned off, and the switch SW30 is turned on. Furthermore, the switch SW60 is connected to the output terminal T3 of the differential amplifier circuit 110, and the switch SW70 is connected to the output terminal T4 thereof.

At this time, the capacitors Cs1 and Cs2 are short-circuited by the switch SW30 to have the same potential. Therefore, the electrical charges are moved to the capacitors Cf1 and Cf2. Accordingly, a potential difference (Vop−Vom) between the voltages of the output terminals T3 and T4 of the differential amplifier circuit 110 is calculated according to the following formula (3).

$$Vo=Vop-Vom=Cs/Cf\times\{(Vip-Vc1)-(Vim-Vc2)+Voff\} \quad (3)$$

The offset voltage Voff is included in the above formula (3). Therefore, an error is caused in the output voltage Vo. In this embodiment, however, a potential difference between the reference voltages Vc1 and Vc2 is equal to the offset voltage Voff of the differential amplifier circuit 110. Therefore, the output voltage Vo is finally calculated according to the following formula (4).

$$Vo=Vop-Vom=Cs/Cf\times\{(Vip-Vc1)-(Vim-Vc1+Voff)+Voff\}=Cs/Cf\times(Vip-Vim) \quad (4)$$

According to the above formula (4), it is found that the offset voltage Voff is cancelled.

As described above, the amplifier circuit 100 of this embodiment is provided with the differential amplifier circuit 120 that supplies the reference voltages Vc1 and Vc2 having the same potential difference as the offset voltage Voff of the difference amplifier circuit 110. Therefore, the offset voltage Voff of the differential amplifier circuit 110 can be cancelled. As a result, according to this embodiment of the present invention, the characteristics of the amplifier circuit 100 can be improved without being influenced by the offset voltage.

Second Embodiment

Referring to the accompanying drawing, a description is now made of a second embodiment of the present invention. The second embodiment of the present invention is different from the first embodiment only in that it is provided with switches SW90 and SW100 instead of the switch SW30 of the first embodiment. Therefore, a description is made only of the difference between the first and second embodiments. In addition, components the same as those of the first embodiment are denoted by the same reference numerals and their descriptions are omitted in this embodiment.

Figure 3:
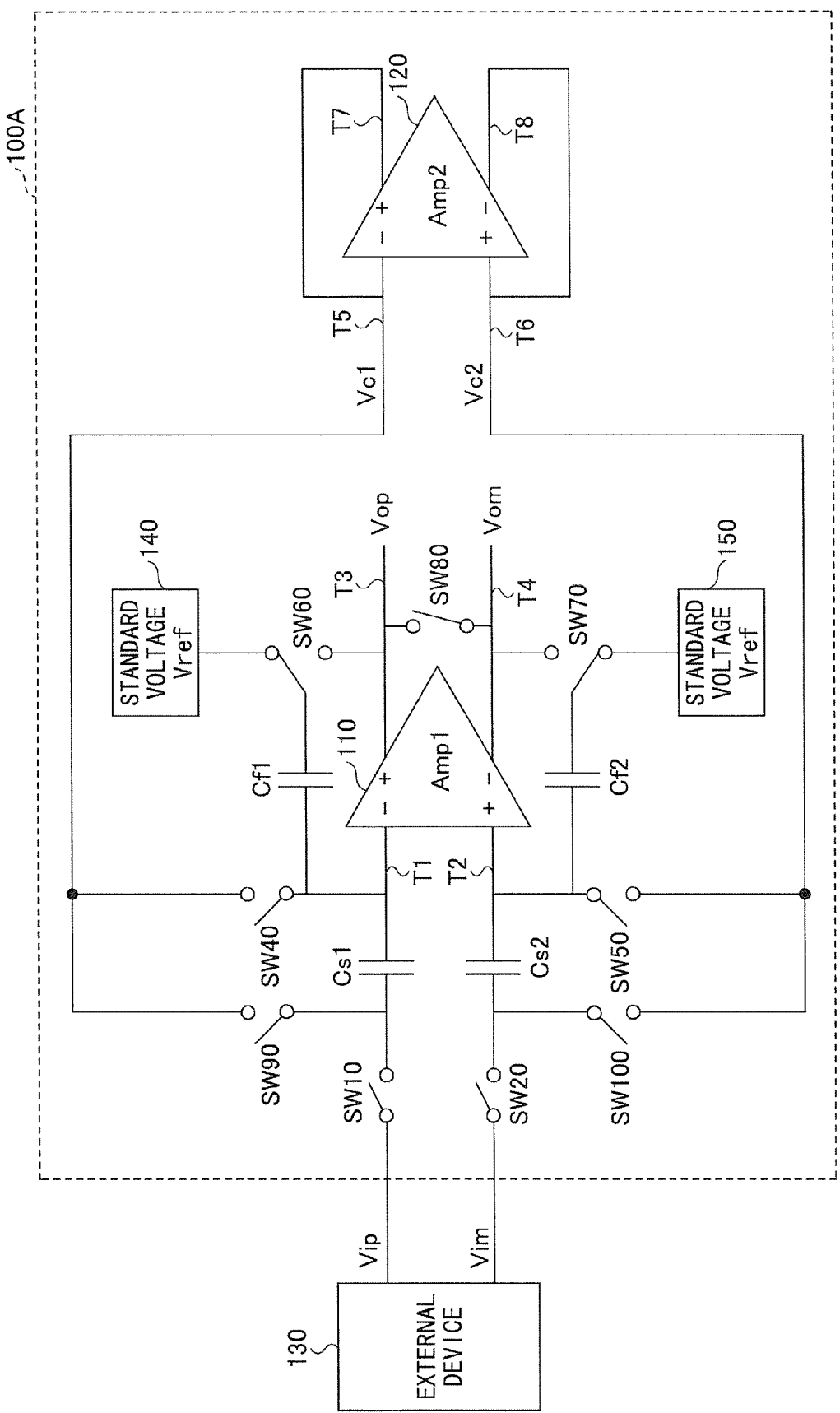
FIG. 3 shows the amplifier circuit 100A of a second embodiment.

FIG. 3 shows an amplifier circuit 100A of the second embodiment. In the amplifier circuit 100A of this embodiment, the switch SW30 of the first embodiment that short-circuits the capacitors Cs1 and Cs2 is replaced by the switches SW90 and SW100.

One end of the switch SW90 is connected to one end of the capacitor Cs1, and the other end thereof is connected to the input terminal T5 of the differential amplifier circuit 120. Furthermore, one end of the switch SW100 is connected to one end of the capacitor Cs2, and the other end thereof is connected to the input terminal T6 of the differential amplifier circuit 120.

The switches SW90 and SW100 are turned on and off at the same timing as the switch SW30 of the first embodiment. In other words, the switches SW90 and SW100 are turned off at the sampling operation and turned on when the sampling operation is completed to establish a signal output state.

With this configuration, the input terminals T5 and T6 of the differential amplifier circuit 120 are connected to the capacitors Cs1 and Cs2, respectively, in the signal output state in this embodiment. Accordingly, in this embodiment, the voltages of the input terminals T1 and T2 are fixed in the signal output state. Therefore, it is possible to further ensure the time (settling time) required until sampling of the input signals of input voltages using a difference in on-resistance between the switches of the amplifier circuit 100A is enabled. As a result, the distortions of an output voltage can be reduced.

Third Embodiment

Referring to the accompanying drawing, a description is now made of a third embodiment of the present invention. The third embodiment of the present invention is a modification of the amplifier circuit 100A of the second embodiment. Therefore, a description is made only of the difference between the second and third embodiments. In addition, components the same as those of the second embodiment are denoted by the same reference numerals and their descriptions are omitted in this embodiment.

Figure 4:
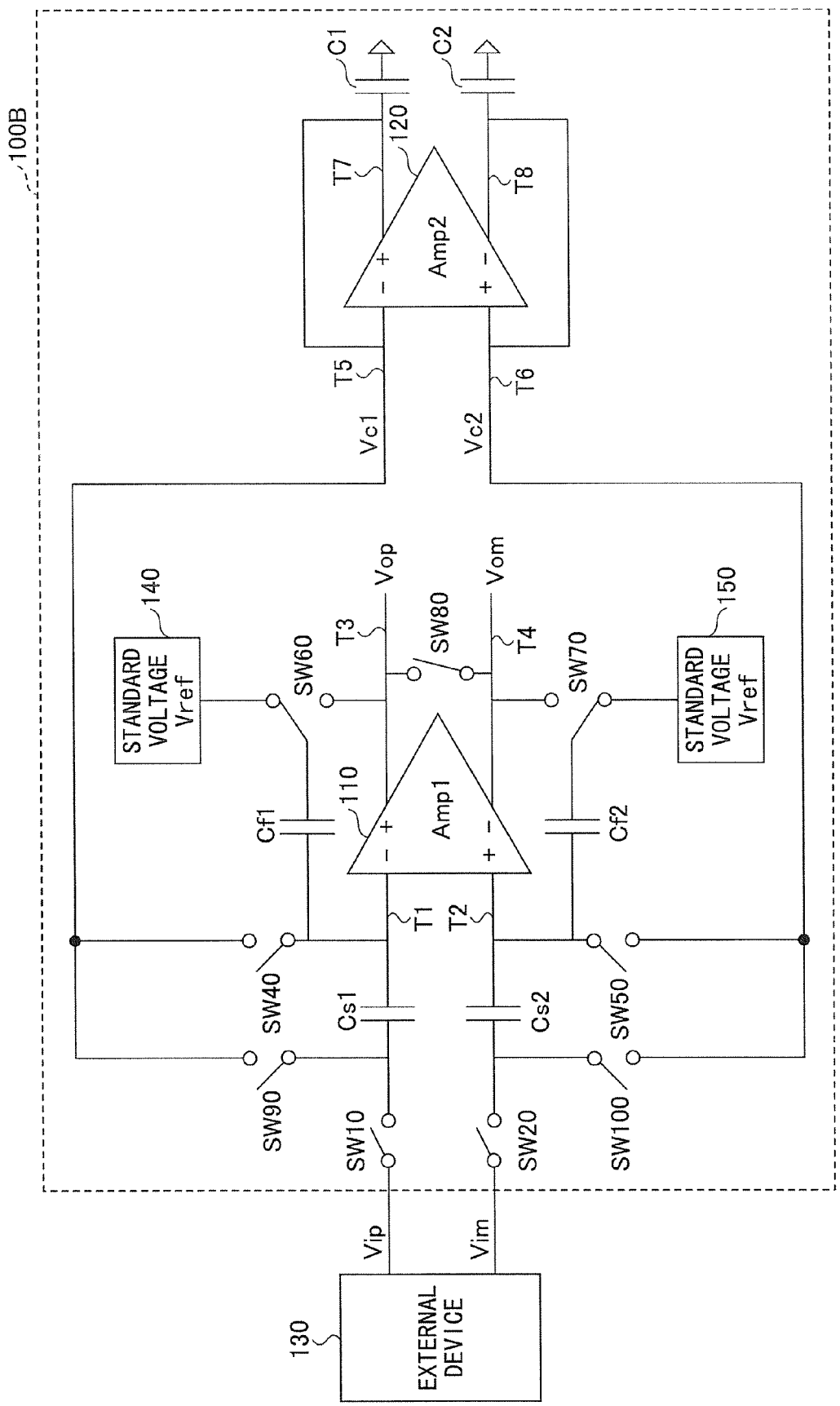
FIG. 4 shows the amplifier circuit 100B of the third embodiment.

FIG. 4 shows an amplifier circuit 100B of the third embodiment. The amplifier circuit 100B of this embodiment is different from the amplifier circuit 100A of the second embodiment in that it has capacitors C1 and C2 for ensuring an output provided in the output terminals T7 and T8 of the differential amplifier circuit 120.

In this embodiment, the output voltages of the output terminals T7 and T8 are ensured by the capacitors C1 and C2. Therefore, a switching noise called a kickback can be reduced. As a result, the characteristics of the amplifier circuit 100B can be further improved.

Note that it is described in the first through third embodiments that the configuration of the differential amplifier circuit 120 has the same configuration as that of the differential amplifier circuit 110. However, the configuration of the differential amplifier circuit 120 is not limited to this.

For example, the size of internal devices such as transistors constituting the differential amplifier circuit 120 may be different from that of internal devices constituting the differential amplifier circuit 110.

If the size of the internal devices constituting the differential amplifier circuit 120 is made smaller than that of the internal devices constituting the differential amplifier circuit 110, the amplifier circuit of the embodiments of the present invention can be downsized and the consumption power thereof can be reduced.

Furthermore, if the size of the internal devices constituting the differential amplifier circuit 120 is made larger than that of the internal devices constituting the differential amplifier circuit 110, an output voltage can be further ensured, which is effective for a large kickback.

According to the embodiments of the present invention, the characteristics of the amplifier circuit can be improved without being influenced by an offset voltage.

The present invention is not limited to the specifically disclosed embodiments, and variations and modifications may be made without departing from the scope of the present invention.

The present application is based on Japanese Priority Application No. 2008-068460 filed on Mar. 17, 2008, the entire contents of which are hereby incorporated herein by reference.

What is claimed is:

1. An amplifier circuit comprising:
   a first input terminal;
   a second input terminal;
   a first differential amplifier circuit that samples signals input to the first and second input terminals and outputs signals obtained by applying a gain to the sampled input signals having different voltages; and
   a second differential amplifier circuit that supplies first and second reference voltages referred to when a sampling operation is performed in the first differential amplifier circuit to the first and second input terminals, respectively; wherein
   a potential difference between the first and second reference voltages is equal to an offset voltage of the first differential amplifier circuit.

2. The amplifier circuit according to claim 1, further comprising:
   a first capacitor one end of which is connected to the first input terminal; and
   a second capacitor one end of which is connected to the second input terminal; wherein
   the first reference voltage is supplied to a connection point between the first input terminal and the first capacitor and to the other end of the first capacitor, and
   the second reference voltage is supplied to a connection point between the second input terminal and the second capacitor and to the other end of the second capacitor.

3. The amplifier circuit according to claim 1, wherein
   the second differential amplifier circuit has first and second output terminals, and
   the first and second output terminals are connected to corresponding capacitors for ensuring an output.

4. The amplifier circuit according to claim 1, wherein
an internal device constituting the second differential amplifier circuit has the same configuration as another internal device constituting the first differential amplifier circuit.

5. The amplifier circuit according to claim 1, wherein
a size of an internal device constituting the second differential amplifier circuit is smaller than a size of another internal device constituting the first differential amplifier circuit.

6. The amplifier circuit according to claim 1, wherein
a size of an internal device constituting the second differential amplifier circuit is larger than a size of another internal device constituting the first differential amplifier circuit.

* * * * *